United States Patent [19]

Levi

[11] 4,229,716
[45] Oct. 21, 1980

[54] AMPLITUDE EQUALIZER CIRCUIT

[75] Inventor: Israel Levi, Ottawa, Canada

[73] Assignee: Northern Telecom Limited, Montreal, Canada

[21] Appl. No.: 39,257

[22] Filed: May 16, 1979

[51] Int. Cl.³ .......................................... H04B 3/04
[52] U.S. Cl. ................................. 333/28 R; 330/85; 330/109
[58] Field of Search ............... 330/107, 109, 294, 304; 333/28 R, 215

[56] References Cited

U.S. PATENT DOCUMENTS

| | | | |
|---|---|---|---|
| 3,679,987 | 7/1972 | Moschytz | 330/109 X |
| 3,906,390 | 9/1975 | Rollett | 330/109 X |
| 3,993,959 | 11/1976 | Boctor | 330/109 X |
| 4,074,204 | 2/1978 | Broburg et al. | 333/28 R X |

*Primary Examiner*—Paul L. Gensler
*Attorney, Agent, or Firm*—John E. Mowle

[57] ABSTRACT

An amplitude equalizer circuit utilizing active components in which unidirectional functional tuning of the amplitude, bandwidth and center frequency, may each be adjusted by varying a single resistance for each parameter. This eliminates the need for ganged-potentiometers or altering a plurality of interacting components.

4 Claims, 1 Drawing Figure

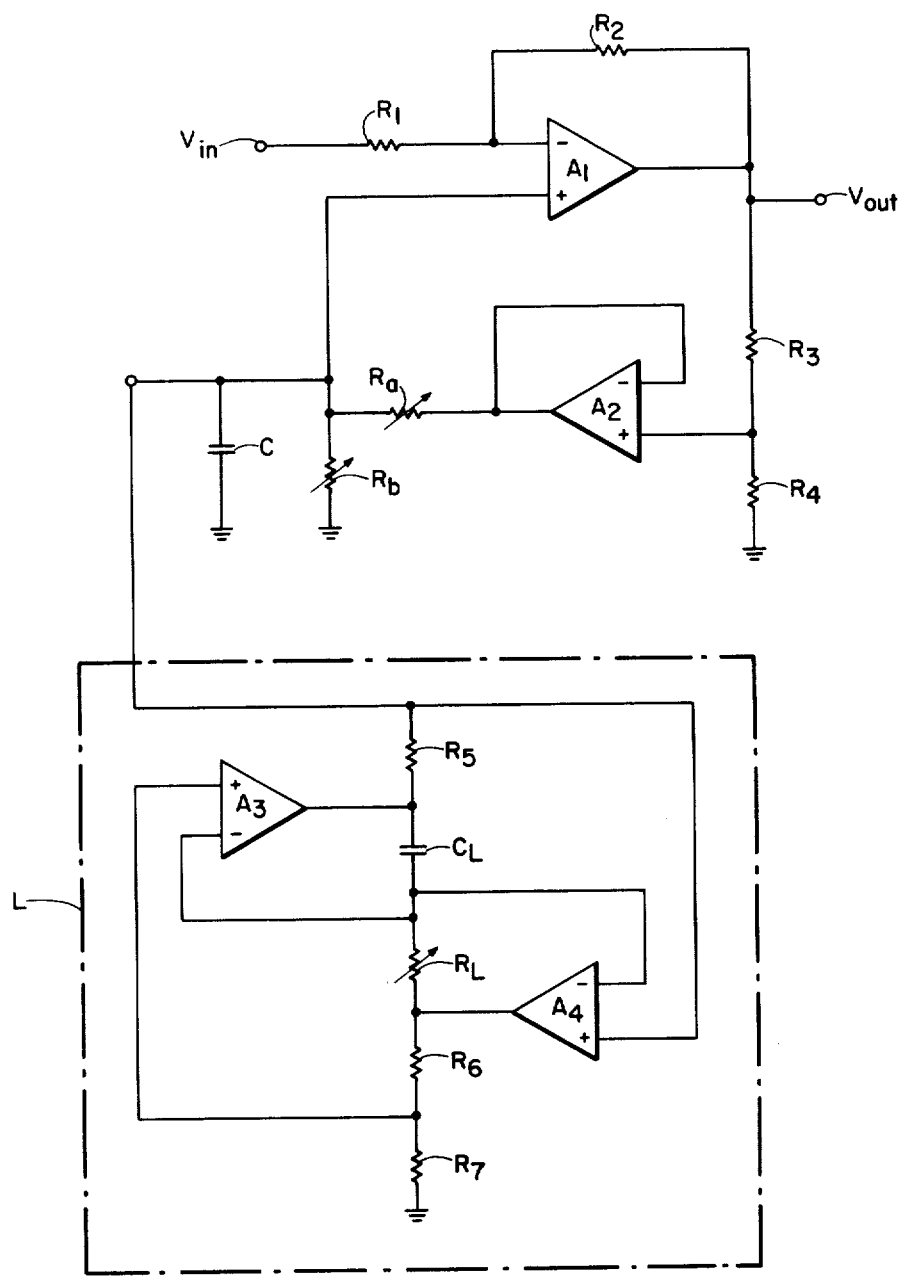

AMPLITUDE EQUALIZER CIRCUIT

This invention relates to an amplitude equalizer circuit and more particularly to one which may have unidirectional functional tuning without utilizing ganged potentiometers, thereby avoiding the associated tracking problems.

BACKGROUND OF THE INVENTION

Variable amplitude equalizer circuits are used in many transmission systems and particularly in long distance telephone circuits to compensate for the ambient operating conditions of the system. U.S. Pat. No. 2,096,027 by Hendrik W. Bode, issued Oct. 19, 1937, described an adjustable attenuation equalizer which is the basis for many such circuits used today.

In the implementation of many of these variable amplitude circuits it is often necessary to vary two circuit components (usually resistors) simultaneously in order to avoid interaction between adjustable parameters. When a discrete step-adjustment technique is required, a chain of resistors and multi-pole switches are used to perform this function. If, however, a continuous adjustment is required, dual ganged potentiometers are used. Either of these techniques requires the use of expensive components which aside from being bulky have inherent tracking problems.

U.S. Pat. No. 3,921,105 issued Nov. 18, 1975 to Franc Brglez discloses a variable attenuation equalizer in which a single variable impedance element is used to provide variable magnitude equalization.

STATEMENT OF THE INVENTION

The present invention extends the concept disclosed in the Brglez patent to enable unidirectional functional tuning of all three parameters—amplitude, bandwidth and frequency—utilizing a single variable resistor for each parameter.

Thus, in accordance with the present invention there is provided an amplitude equalizer circuit which comprises an amplifier having a positive feedback network coupled between its output and a non-inverting input thereof. The network includes a serially connected resistor which may be adjusted to control the amplitude, a shunt-connected resistor which may be adjusted to control the bandwidth and a shunt connected parallel resonant circuit which may be adjusted to control the center frequency of the equalizer circuit. Hence, varying the parallel resonant circuit, the shunt connected resistor, and the serial connected resistor in that order, enables unidirectional functional tuning of the overall circuit.

By simulating the inductance of the parallel resonant circuit utilizing an RC gyrator, the resonant frequency of the circuit can also be controlled by a single variable resistor. As a result, varying the resistor in the simulated inductance, the shunt connected resistor, and the serially connected resistor in that order enables unidirectional functional tuning of the amplitude equalizer circuit. The general form of the transfer function required to realize this equalizer circuit is given by:

$$T(s) = \frac{s^2 + sh\frac{\omega_o}{Q} + \omega_o^2}{s^2 + s\frac{\omega_o}{Q} + \omega_o^2} \quad (1)$$

where:
- s = complex frequency variable
- h = amplitude factor
- $\omega_o$ = pole resonant frequency
- Q = quality factor

BRIEF DESCRIPTION OF THE DRAWING

An example embodiment of the invention will now be described with reference to the accompanying drawing in which the single FIGURE is a schematic circuit diagram of a functionally tunable RC-active variable amplitude equalizer circuit.

DESCRIPTION OF THE PREFERRED EMBODIMENT

Referring to the single FIGURE of the variable amplitude equalizer circuit, input signals $V_{in}$ are coupled through a resistor $R_1$ to the inverting input of an operational amplifier $A_1$. The amplifier has both positive and negative feedback, the latter being obtained by a resistor $R_2$ coupled from the output to the inverting input of the amplifier $A_1$.

Signals for the positive feedback path are first coupled through a voltage divider comprising resistors $R_3$ and $R_4$. The junction of these resistors is coupled to the non-inverting input of a second operational amplifier $A_2$ which essentially has unity voltage gain as a result of the direct connection between its output and its inverting input. The output of the amplifier $A_2$ is coupled through an adjustable series connected resistor $R_a$ back to the non-inverting input of amplifier $A_1$. A shunt connected variable resistor $R_b$ is coupled from the non-inverting input of amplifier $A_1$ to a common terminal or ground.

A parallel resonant circuit comprising a simulated inductance L and a capacitor C is connected in shunt with the variable resistor $R_b$. The simulated inductance which comprises two operational amplifiers $A_3$ and $A_4$, three fixed resistors $R_5$, $R_6$ and $R_7$, a fixed capacitor $C_L$ and a variable resistor $R_L$ is well known and has been described in an article by A. Antoniou, entitled "Novel RC-Active-Network Synthesis Using Generalized-Immittance Coverters", IEEE Trans. on Circuit Theory, Vol. CT-17, No. 2, May 7, 1970, pp. 212–217; and on pp 362–365 of the text "Modern Filter Theory & Design" by Gabor C. Tewes and Sonjit K. Mitra, published by John Wiley & Sons Inc., 1973. It will be evident that a passive inductor could be substituted for this active element. However, the latter has the advantage of providing a variable resonant circuit at audio frequencies by altering a single variable resistor rather than a relatively large variable inductor or capacitor.

The above transfer function of equation (1) in terms of circuit components for the single FIGURE is given by:

$$T(s) = \frac{V_{out}}{V_{in}}(s) = -\frac{s^2 + s\frac{(R_b + R_a)}{C R_a R_b} + \frac{1}{LC}}{s^2 + s\frac{1}{CR_b} + \frac{1}{LC}} \quad (2)$$

where: 
$$L = \frac{R_L C_L R_5 R_7}{R_6}$$

$$\omega_o^2 = \frac{1}{LC}$$

$$\frac{\omega_o}{Q} = \frac{1}{CR_b}$$

-continued
$$h = \frac{R_b + R_a}{R_a}$$

It will be apparent from equation (2) that the amplitude h can be altered by adjusting resistor $R_a$ without affecting the bandwidth $\omega_o/Q$ or the frequency $\omega_o$. Similarly, the bandwidth $\omega_o/Q$ can be adjusted by varying resistor $R_b$ without affecting the frequency $\omega_o$. Consequently unidirectional functional tuning of the equalizer circuit can be achieved by first adjusting the simulated inductance by varying the resistance $R_L$ then by varying the bandwidth by adjusting resistor $R_b$ and finally by adjusting the amplitude by varying the resistor $R_a$. Consequently, there is provided a variable amplitude equalizer circuit in which all three parameters can be altered in a unidirectional sequence without the necessity for utilizing variable ganged components. Such a realization can be readily used in integrated circuit design where resistive trimming is commonly used to provide the final circuit values. Also it will be evident that any or all of the parameters need not necessarily be adjustable in which case fixed resistors would be used in place of the variable resistors $R_a$, $R_b$ and $R_L$. In addition the resistors $R_1$ through $R_7$ may be of the same value.

What is claimed is:
1. A variable amplitude equalizer circuit comprising:
   first and second operational amplifiers each having an inverting input, a non-inverting input and an output;
   a signal input and signal output coupled respectively to the inverting input and output of the first operational amplifier;
   a resistive divider network coupling the output of the first operational amplifier to the non-inverting input of the second operational amplifier;
   a first resistor connected in series between the output of the second amplifier and the non-inverting input of the first amplifier for controlling the amplitude of the equalizer circuit;
   a second resistor connected in shunt across the non-inverting input of the first amplifier to control the bandwidth of the equalizer circuit;
   a parallel resonant network connected in shunt across the non-inverting input of the first amplifier to control the center frequency of the equalizer circuit;
   whereby varying the parallel resonant network, the shunt connected resistor and the serially connected resistor in that order enables unidirectional functional tuning of the equalizer circuit.

2. A circuit as defined in claim 1 which additionally includes a pair of resistors serially connected between the signal input and the signal output, the junction thereof being connected to the inverting input of the first operational amplifier, the value of each of the pair of resistors being the same as those of the resistive divider network.

3. A circuit as defined in claim 2 in which the inductive portion of the parallel resonant network is a resistive controlled variable gyrator.

4. A circuit as defined in claim 1 in which the transfer function of the circuit equals:

$$T(s) = -\frac{s^2 + s\frac{(R_b + R_a)}{CR_a R_b} + \frac{1}{LC}}{s^2 + s\frac{1}{CR_b} + \frac{1}{LC}}$$

where:
T(s)=$V_{out}/V_{in}$ the transfer function of the equalizer circuit;
$R_a$=the value of the series resistor;
$R_b$=the value of the shunt resistor;
C=the value of the capacitance in the resonant circuit;
L=the value of the inductance in the resonant circuit.

* * * * *